United States Patent

Krishnan et al.

Patent Number: 5,994,742
Date of Patent: Nov. 30, 1999

[54] PLASMA EMISSION TRIGGERED PROTECTION DEVICE FOR PROTECTING AGAINST CHARGE-INDUCED DAMAGE

[75] Inventors: Srikanth Krishnan, Richardson; Ajith Amerasekera, Plano, both of Tex.

[73] Assignee: Texas Instruments Incorporated, Dallas, Tex.

[21] Appl. No.: 08/759,588

[22] Filed: Dec. 5, 1996

Related U.S. Application Data

[60] Provisional application No. 60/008,419, Dec. 8, 1995.

[51] Int. Cl.⁶ ................................................. H01L 23/62
[52] U.S. Cl. ............................ 257/355; 257/431; 257/48
[58] Field of Search .............................. 257/48, 328, 355, 257/431; 438/16, 17, 18, 485; 324/769

[56] References Cited

U.S. PATENT DOCUMENTS

| | | | |
|---|---|---|---|
| 4,543,597 | 9/1985 | Shibata | 257/296 |
| 4,941,028 | 7/1990 | Chen et al. | 257/322 |

Primary Examiner—Nathan K. Kelley
Attorney, Agent, or Firm—Mark A. Valetti; Carlton H. Hoel; Richard L. Donaldson

[57] ABSTRACT

One embodiment of the instant invention is a charge-induced damage protection device (100 or 500) for protecting a semiconductor device (200) which is formed on a common substrate with the protection device, the protection device comprising: a region in the substrate; and wherein the region is accessible to electromagnetic energy during processing in which charges may collect on conductive material such that the protective device turns on at a lower voltage due to introduction of the electromagnetic energy to the region so as to protect the semiconductor device from the charge-induced damage. Preferably, the protection device is selected from the group consisting of: a diode, a thyristor, a bidirectional thyristor, a bipolar transistor, and a polymer that becomes more conductive upon being illuminated by electromagnetic energy. The protection device of this embodiment may include a layer situated above the substrate, the layer having an opening (102) above the active region such that the electromagnetic energy passes through the opening to the active region. In another embodiment, the protection device would include a layer situated above the substrate, the electromagnetic energy passing between the substrate and the layer so as to illuminate the active region.

6 Claims, 4 Drawing Sheets

PLASMA EMISSION TRIGGERED PROTECTION DEVICE FOR PROTECTING AGAINST CHARGE-INDUCED DAMAGE

This application claims priority under 35 USC §119(e) (1) of provisional application Ser. No. 60/008,419, filed Dec. 8, 1995.

CROSS-REFERENCE TO RELATED PATENT/ PATENT APPLICATIONS

The following commonly assigned patent/patent applications are hereby incorporated herein by reference: U.S. application Ser. Nos. 08,728,718 filed Oct. 11, 1996, and 08,729,477 filed Oct. 11, 1996.

FIELD OF THE INVENTION

The instant invention pertains to semiconductor device fabrication and processing, and more specifically to protection devices for protecting against charge-induced damage to semiconductor devices.

BACKGROUND OF THE INVENTION

Process-induced damage is becoming a very serious concern for semiconductor device manufacturer's. Such damage accounts for device degradations and lower yields. One type of process-induced damage is charge-induced damage. Charge-induced damage can occur during plasma etch and plasma-enhanced deposition processes (collectively referred to as plasma charging damage), ash, and ion implantation. Charge-induced damage is becoming particularly important due to: the scaling down of gate oxide thicknesses and channel length with succeeding technologies; increasing levels of metalization; and the advent of high density plasma sources for etching and deposition.

With respect to charge-induced damage, the charge collected in the antenna stresses the oxide of a device. More specifically, in a MOSFET structure, the charge collected on the antenna stresses the gate oxide of the MOSFET, thereby inducing stress-related degradation of the MOSFET. This stress-related degradation may include: shortening the lifetime of the device, increasing the gate leakage of the device, or shifting the threshold voltage of the device. In view of this, it is an object of the instant invention to provide a protection device that will protect electronic circuitry from any charge-induced damage that would occur during plasma processing or any other charge-related processing.

SUMMARY OF THE INVENTION

One embodiment of the instant invention is a charge-induced damage protection device for protecting a semiconductor device which is formed on a common substrate with the protection device, the protection device comprising: a region in the substrate; and wherein the region is accessible to electromagnetic energy during processing in which charges may collect on conductive material such that the protective device turns on at a lower voltage due to introduction of the electromagnetic energy to the region so as to protect the semiconductor device from the charge-induced damage. Preferably, the protection device is selected from the group consisting of: a diode, a thyristor, a bidirectional thyristor, a bipolar transistor, an amorphous silicon resistor, a polysilicon resistor, and a polymer that becomes more conductive upon being illuminated by electromagnetic energy. The electromagnetic radiation is preferably selected from the group consisting of: white light, ultraviolet light, infrared energy, and any other electromagnetic energy. The protection device of this embodiment may include a layer situated above the substrate, the layer having an opening above the region such that the electromagnetic energy passes through the opening to the region. The region can be exposed to the electromagnetic radiation during processing until the opening is covered or the protection device is encapsulated. Preferably, the layer is comprised of a material selected from the group consisting of nitride, polycrystalline silicon, metals, oxide, or any combination thereof. In another embodiment, the protection device would include a layer situated above the substrate, the electromagnetic energy passing between the substrate and the layer so as to illuminate the region. Preferably, this layer is comprised of a material selected from the group consisting of: nitride, polycrystalline silicon, metals, oxide, or any combination thereof.

Another embodiment of the instant invention is a charge-induced damage protection device for protecting a semiconductor device which is formed on a common substrate with the protection device, the protection device comprising: an active region in the substrate; and wherein the active region is accessible to electromagnetic energy during processing in which charges may collect on conductive material such that the protective device triggers at a lower voltage so as to protect the semiconductor device from the charge-induced damage.

Another embodiment of the instant invention is a protection device for protecting a semiconductor device from charge-induced damage during processing, the protection device comprising: a substrate of a first conductivity type and having a surface, the protection device and the semiconductor device formed on the substrate; a first doped region of a second conductivity type opposite the first conductivity type and formed in the substrate; a second doped region formed in the substrate and spaced away from the first doped region; a first contact/via abutting the first doped region and extending away from the substrate, the first contact/via having an upper surface; a second contact/via abutting the second doped region and extending away from the substrate, the second contact/via having an upper surface which is spaced from the upper surface of the first contact/via and which extends over substantially all of the second doped region; and an aperture formed by the space between the upper surfaces of the first and second contact/ vias, the aperture formed over a portion of the first doped region such that upon introduction of electromagnetic energy during processing upon the protection device the electromagnetic energy will pass through the aperture to the first doped region thereby changing at least one electrical characteristic of the protection device. One electrical characteristic that may be changed is that the protection device is turned on at a lower potential upon introduction of the electromagnetic energy to the first doped region. In an alternative embodiment of the instant invention, the second doped region is of the second conductivity type and the protection device is a transistor. In another alternate embodiment, the second doped region is of the first conductivity type and the protection device is a diode. Preferably, an insulating region is formed between the first and second doped regions, or a gate structure is insulatively disposed on the surface of the substrate and between the first and the second doped regions.

Another embodiment of the instant invention is a protection device for protecting a semiconductor device from chargeinduced damage during processing, the protection device comprising: a substrate of a first conductivity type and having a surface, the protection device and the semiconductor device formed on the substrate; a well region of a second conductivity type opposite the first conductivity type and formed in the substrate; a first doped region of the second conductivity type and formed in the well region; a second doped region of the first conductivity type and formed in the well region and spaced away from the first doped region; a third doped region of the second conductivity type and formed in the substrate and away from the well region; a fourth doped region of the first conductivity type, the fourth doped region formed in the substrate and away from the third doped region and the well region; a first layer situated above the substrate and extending over the first doped region, the second doped region, and a portion of the well region; a second layer situated above the substrate and extending over the third doped region and the fourth doped region, the second layer spaced away from the first layer; and an aperture formed by the space between the first and second layers, the aperture formed over a portion of the well region which is situated between the second and third doped regions such that upon introduction of electromagnetic energy during processing upon the protection device the electromagnetic energy will pass through the aperture to the well region thereby changing at least one electrical characteristic of the protection device. An electrical characteristic that may be changed is such that the protection device is turned on at a lower potential upon introduction of the electromagnetic energy to the well region.

BRIEF DESCRIPTION OF THE DRAWINGS

FIG. 1a illustrates both a diode and a transistor.

FIG. 1b is a cross sectional view of the device illustrated in FIG. 1a. FIG. 1b being taken substantially along line 1b—1b of FIG. 1a.

FIG. 3b is an I–V curve illustrating the performance of the device depicted in FIGS. 1a, 1b, and 2a.

FIG. 5a illustrates a thyristor.

FIG. 5b is a cross sectional view of the device illustrated in FIG. 5a. FIG. 5b being taken substantially along line 5b—5b of FIG. 5a.

DETAILED DESCRIPTION OF THE DRAWINGS

An object of the instant invention is to provide a protection device that will protect electronic circuitry from in-process charging. The protective circuitry of the instant invention utilizes the phenomena of "photogeneration" so as to reduce the impedance of the protective element and to render the protection devices of the instant invention more conductive at lower voltages. See S. M. SZE, PHYSICS OF SEMICONDUCTOR DEVICES 744–787 (Wiley-Interscience Publication) (2nd ed. 1981). In other words, while devices are fabricated, the protective devices of the instant invention are "illuminated" with "white" light, ultraviolet light, infrared light, x-ray energy, heat, or some other electromagnetic energy so as to alter the characteristics of the protective device of the instant invention. Due to the "illumination" of the protective device of the instant invention during processing, the protective device will conduct at a lower potential thereby protecting the other semiconductor devices from the build-up of charges during plasma processing. In order for optimal performance of the instant invention, the junction of the protection element would preferably be directly accessible to the incident electromagnetic energy. However, instead of directly subjecting the junction to such energy, the energy may be channeled to the junction through a pseudo-waveguide formed of metal, polycrystaline silicon, or other "reflective" or "refractive" structures.

In the case of incident light, for example, any metal above the junction would block the incident light and prevent the photogeneration effect from taking place. In fact, this type of configuration can be utilized for turning off junctions which are not required to be "on" during the incident energy. In the case of an encapsulated device, the packaging effectively blocks the incident light and the protection device of the instant invention is no longer "illuminated". Thus, the protective device of the instant invention is rendered less conductive, and, therefore, it would be less likely to conduct during normal operation of the semiconductor device which was to be protected. However, once the entire device structure is encapsulated, the protective devices of the instant invention are no longer "illuminated" thereby rendering them less conductive and, therefore, less likely to conduct during normal operation of the semiconductor device which was to be protected.

Figure 1A:
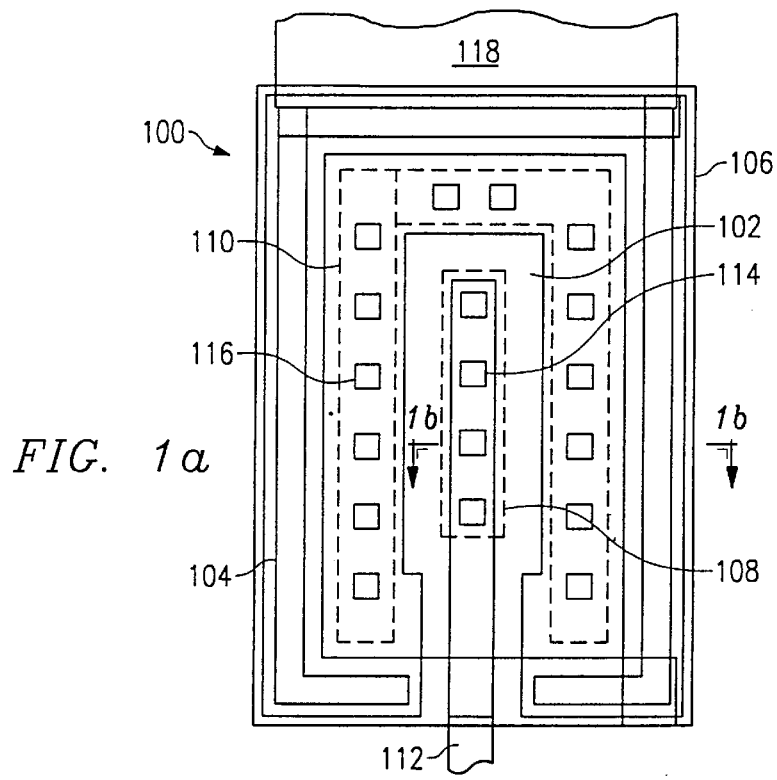
FIG. 1a is plan view of two embodiments of the instant invention.
Figure 5A:
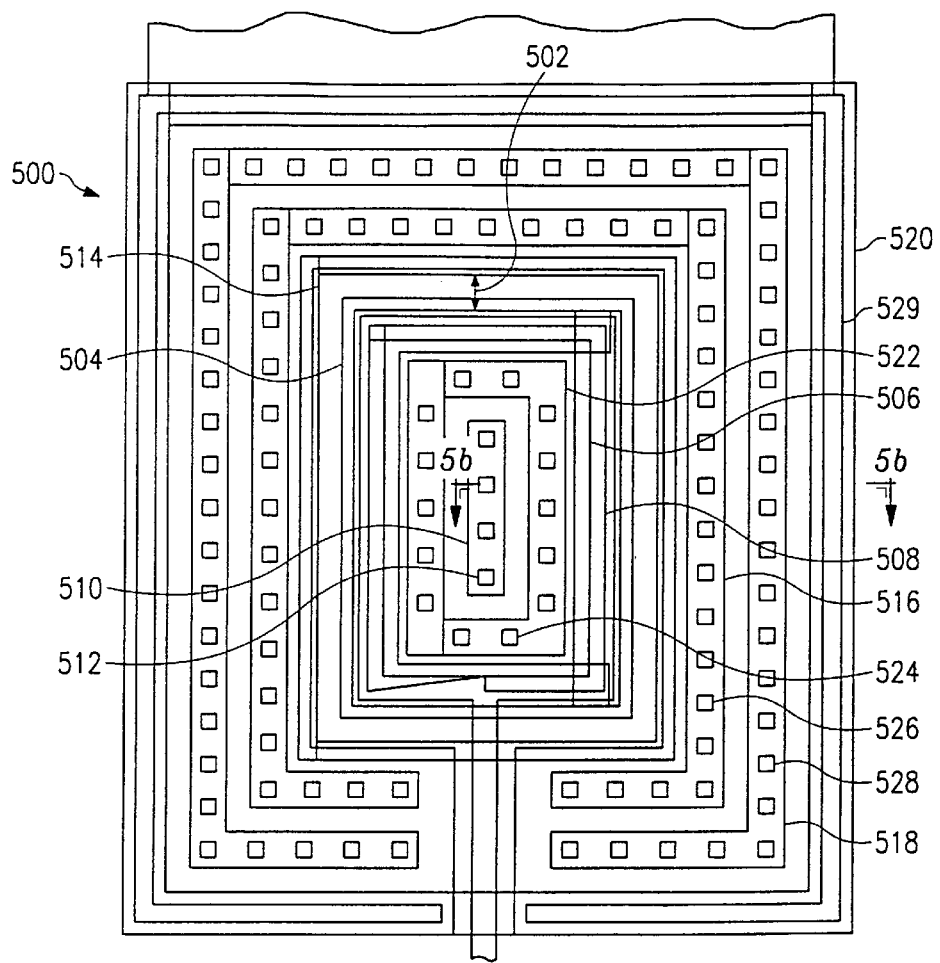
FIG. 5a is plan view of an embodiment of the instant invention

One advantage of the instant invention is that the protection device is preferably symmetrical which results in enhanced protection no matter which direction the charging current flows. Referring to FIGS. 1a and 5a, protection devices 100 and 500 are symmetrical, because of this, protection devices will provide enhanced protection no matter whether the charging current flows in the x-direction, the y-direction, or into the device (z-direction).

Figure 1B:
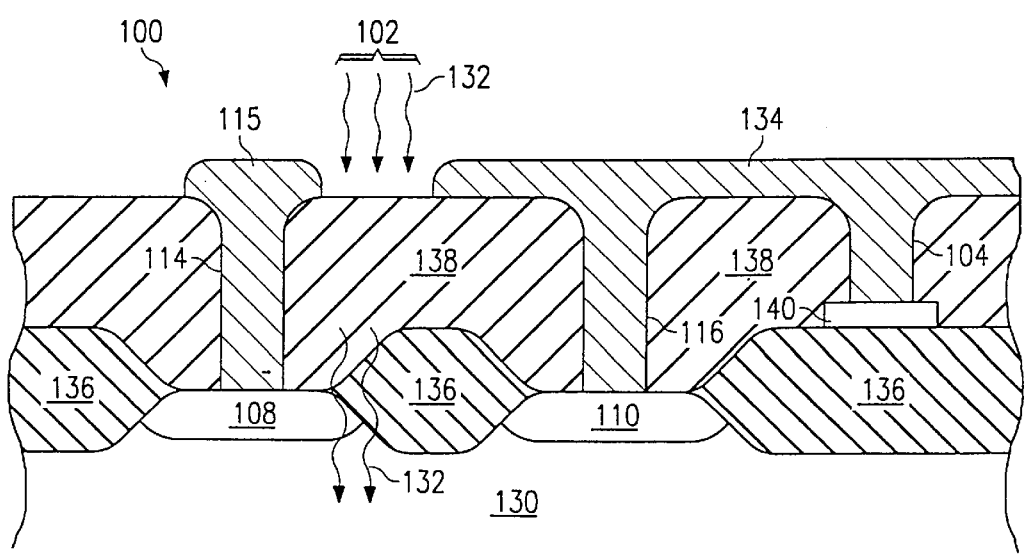

Referring to FIGS. 1a and 1b, protective device 100 may formed from a transistor or a diode. In order to form a diode, region 110 would be doped of one type of dopants (preferably p-type dopants for a p-type substrate) while region 108 would be of the opposite dopant type (preferably n-type). In order to form a transistor, regions 108 and 110 would be of one dopant type (preferably n-type) while the substrate would be of the opposite dopant type (preferably p-type). In this configuration, region 108 would form the collector of the transistor, region 110 would form the emitter of the transistor, and the substrate would form the base of the transistor. In both configurations, regions 136 are field insulator regions (preferably formed of oxide or nitride) and region 138 is a dielectric layer preferably some form of glass, BPSG or PSG, or an oxide). In addition, via/contacts 114, 116 and 104 form contacts to region 108, region 110, and contact landing pad 140 (preferably formed of polycrystalline silicon).

The via/contacts are connected to conductive lines 115 and 134. Conductive lines 115 and 134 provide for external connections to regions of protective device 100 in addition to shielding portions of protective device 100 from the electromagnetic energy that is used to "illuminate" selective portions of protective device 100. Illumination window 102 is an opening between conductors 115 and 134 which allows for electromagnetic energy 132, which is directed at protective device 100 during plasma processing (or any other processing that introduces charging to the devices which are being fabricated), to reach substrate 130. This causes photogeneration which results in protective device 100 being more conductive and having a lower "on" voltage (if protective device 100 is a transistor).

Figure 2A:
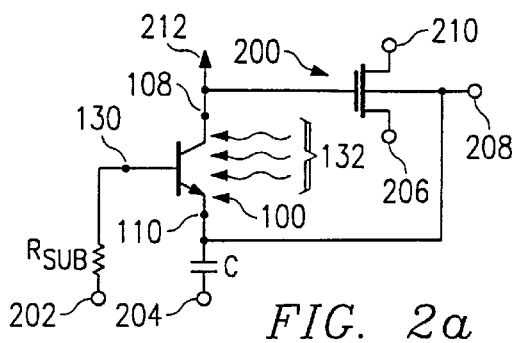
FIG. 2a is a schematic diagram of one embodiment of the instant invention. The schematic of FIG. 2a illustrates the transistor, which is depicted in FIGS. 1a and 1b, in conjunction with a charge collecting antenna and the device which is to be protected.

FIG. 2a illustrates protection device 100 (FIGS. 1a and 1b) wherein protective device 100 is configured as a transistor. This is accomplished be making regions 110 and 108 the same dopant type. Preferably, charge collecting antenna 212 (which can be any metal, conductor, or semiconductor) is connected to the device to be protected (device 200) and the collector of protection device 100. Since the base of protection device 100 is formed by the substrate (substrate 130 of FIG. 1b), there is a small substrate resistance, $R_{SUB}$ between protection device 100 and terminal 202. The emitter is connected to terminal 204 via capacitor, C. Capacitor, C, represents the capacitance associated with the floating substrate and the chuck, which the wafer resides. In addition, C may also include the capacitance associated with the substrate and the plasma, itself. Capacitor, C, is an important part of the turn-on mechanism because it is a significant factor in determining the extent of the charge that is available for the bipolar transistor and SCR devices to turn-on.

Device 200 may be one device or a series of devices. Device 200 is depicted in FIG. 2a as an FET, but device 200 may be any type of device or even circuitry. Device 200 is connected to terminals 206, 208, and 210. While each of the figures shows terminal 208 directly connected between the protection device (100 or 500) and capacitor, C, this may not be the case if the protective device is situated in a different well then the device to be protected or if the device to be protected is sitting in a well that is shared with the protection device. In such a case, a small resistance and a small capacitance would exist between terminal 208 and the node which is situated between capacitor, C, and the protection device.

Figure 2B:
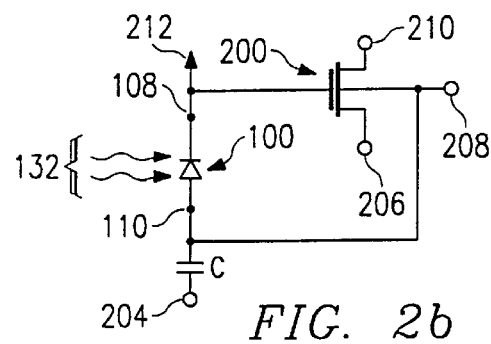
FIG. 2b is a schematic diagram of one embodiment of the instant invention. The schematic of FIG. 2a illustrates the diode, which is depicted FIGS. 1a and 1b, in conjunction with a charge collecting antenna and the device which is to be protected.

FIG. 2b illustrates protection device 100 wherein protection device 100 is configured as a diode. This is accomplished by making regions 110 and 108 from different dopant types. Preferably, the cathode of protection device 100 is connected to antenna 212 and the gate of device 200. In another embodiment of the instant invention, protection device 100 may be comprised of two or more similarly polarized diodes or it may be comprised of two or more, oppositely polarized, diodes. In other words, for the configuration with oppositely polarized diodes, the protection device could be a two terminal device with the first terminal connected to the anode of the first diode and the cathode of the second diode, and the second terminal would be connected to the cathode of first diode and the anode of the second diode. In addition, protection device 100 may be comprised of two or more diodes, which are either similarly polarized or oppositely polarized, in series. Connecting at least two oppositely polarized diodes in series is important where the antenna node (the node between antenna 212, protection device 100, and device 200) could take on a positive or negative polarity during normal operation. More specifically, if the antenna node has a positive potential during normal operating conditions then the protection device of FIG. 2b is proper. However, if a negative potential is applied to that node then the diode should be oppositely polarized, and if the antenna will be subjected to both positive and negative potentials during normal operation of device 200 then device 100 should be comprised of two or more oppositely polarized diodes.

An NPN transistor can be formed as shown in FIG. 1b with a collector (region 108), a base (region 130), and an emitter (region 110). Regions 115 and 134 are preferably metal covering the transistor. Opening 102 is formed between these two regions such that the electromagnetic radiation emitted during processing can reach the collector-base junction of transistor 100. The incident energy on the reverse-biased junction results in the photogeneration of electron-hole pairs. The electrons are conducted into the collector region away from the junction, and, therefore, do not play a significant role in the protective behavior of the device. The holes are conducted through the substrate region 130 (base) which results in a voltage drop in the base which forward biases the emitter (region 110) to base (region 130) junction, thus turning on the NPN transistor. The collector-base voltage of the NPN transistor in the "on" state is much lower than the collector-base voltage when the NPN transistor is "off".

Figure 3A:
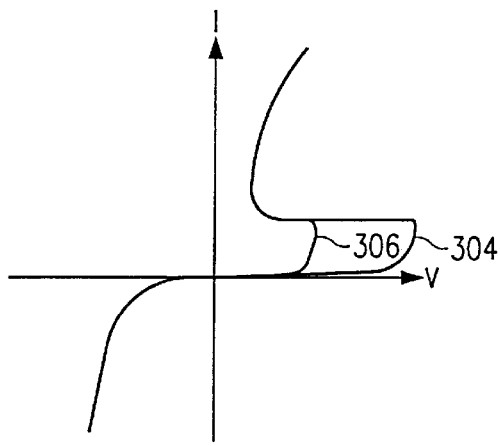
FIG. 3a is an I–V curve illustrating the performance of the device depicted in FIGS. 1a, 1b, and 2b.

FIG. 3a illustrates the I–V characteristics of the protective device 100 wherein it is configured as a transistor, as is illustrated in FIG. 2a. Plot 304 illustrates the I–V characteristics of the transistor of FIGS. 1a, 1b, and 2a wherein the active region of the transistor is not "illuminated" (or is shielded from illumination). Plot 306 illustrates the I–V characteristics of the same transistor of the instant invention wherein the transistor is "illuminated" with electromagnetic energy 132 (preferably "white" light, ultraviolet light, infrared light, or other spectral electromagnetic radiation) through illumination window 102. Note, that the plots are basically the same except that the "on" voltage is less for the transistor that is "illuminated".

Figure 3B:
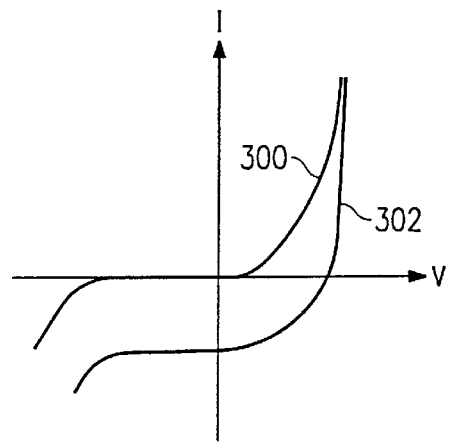

FIG. 3b illustrates the I–V characteristics of the protective device 100 wherein it is configured as a diode, as is illustrated in FIG. 2b. Plot 300 represents the performance of a diode that is shielded from the electromagnetic illumination. Plot 302 illustrates the performance of protection device 100 wherein at least a portion of it is illuminated through window 102 with electromagnetic radiation 132.

Figure 4:
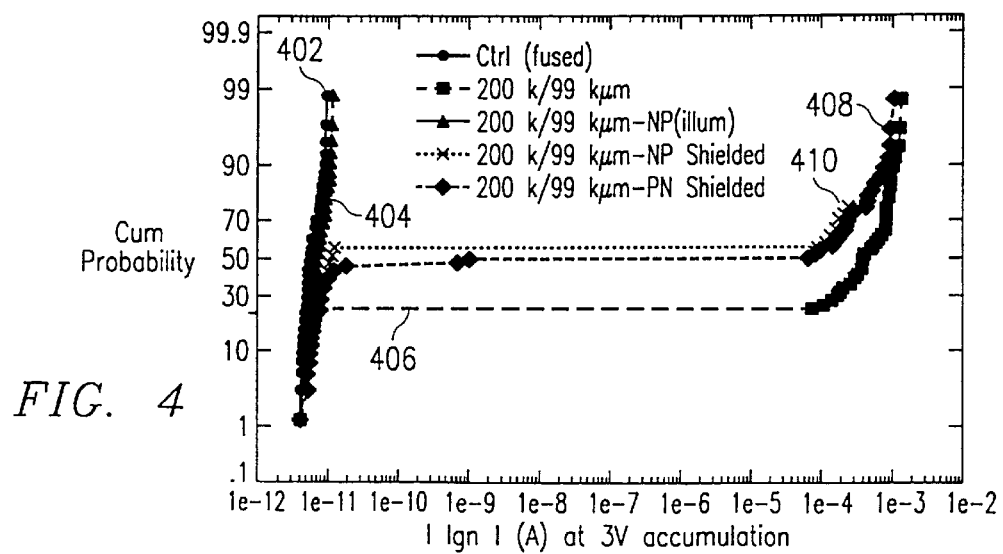
FIG. 4 is a graph illustrating the amount of charging that occurs to a device with and without shielding of the protective device of the instant invention from electromagnetic radiation.

FIG. 4 illustrates the effect of charging on gate leakage of a transistor with and without plasma illuminated diode protection for wafers processed through a metal etch reactor with excessive plasma charging. The measured gate leakage current of an undamaged control device (a control device that has been decoupled from the charge-collecting antenna) is less than $2 \times 10^{-11}$ amps (plot 402), while the gate leakage current for a device that is connected to a charge-collecting antenna is less than $1 \times 10^{-5}$ amps (plot 406) for 70% of the sites on the wafer. However, the transistor remains relatively undamaged even when connected to a charge-collecting antenna when protected by the plasma illuminated diode of the instant invention (plot 404). In other words, the device protected by the plasma illuminated diode of the instant invention (plot 404) has approximately the same gate leakage current as the undamaged control device (plot 402). Conversely, if the diode is shielded from illumination (plots 408 and 410), there is extensive charging with the severity of the charging resulting in only a slightly lower gate leakage current value than the unprotected device (plot 406).

Figure 5B:
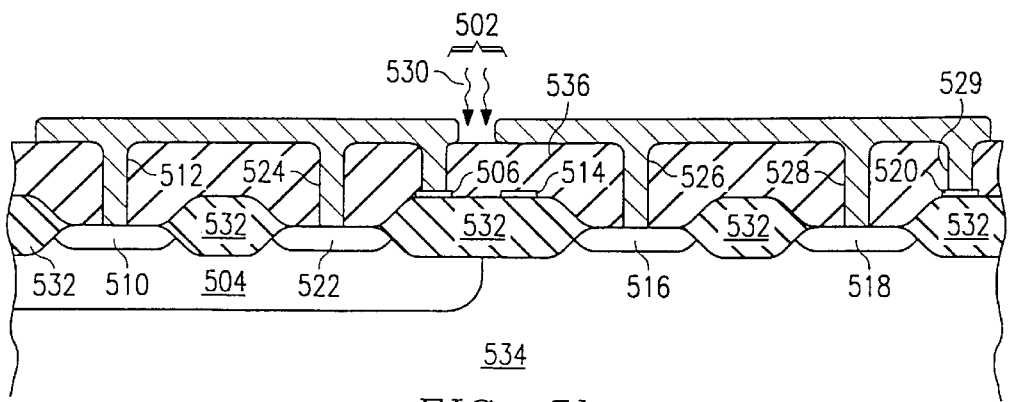

Referring to FIGS. 5a and 5b, the protection device of another embodiment of the instant invention may be formed from a thyristor. Thyristor 500 is preferably an NP-N-P device which is rendered more conductive by "illuminating" a portion of device 500 with electromagnetic energy 530 through window 502 and region 536 (preferably a transparent material such as glass, BPSG, or PSG). Preferably, substrate 534 is p-type and regions 522 and 518 are heavily doped with p-type dopants. In addition, regions 510 and 516 are preferably heavily doped n-type regions and region 504 is an n-type well. In this configuration, two transistor are formed from these regions. The first transistor is defined by: region 504 is the base; region 510 is the base contact; region 522 is the emitter; and the substrate forms the collector with region 518 forming a contact to the substrate. The second transistor is formed such that the base is formed from the substrate with region 518 providing the contact to the base; the emitter is formed by region 516; and the collector is formed by well 504 with region 510 providing the contact to the collector. The collector-base junctions of the two transistors (preferably an NPN transistor and a PNP transistor) are both formed by well region 504 (preferably n-type) to substrate 534 junction. This is the region that is preferably exposed to the electromagnetic energy, thus enabling the photogeneration of carriers in the reverse-biased collector-base junction. These carriers will lower the impedance of the junction as well as provide a current source to turn-on the SCR Regions 506, 514, and 520 are preferably formed from polycrystaline silicon and provide contact landing pads and absorb electromagnetic energy. Contacts/vias 512, 524, 526, and 528 provide connections to selective portions of device 500. Contact/via 529 and region 514 are contact trenches.

Figure 6A:
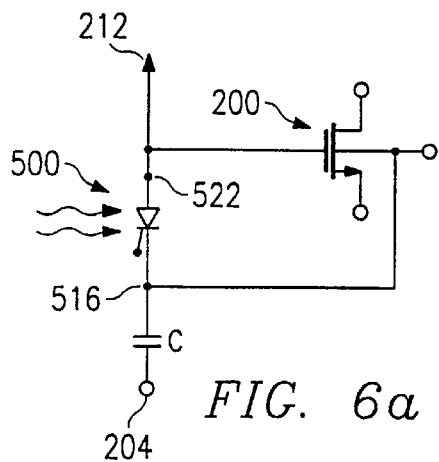
FIGS. 6a and 6b are schematic diagrams of one embodiment of the instant invention. The schematics of FIGS. 6a and 6b illustrate the devices of FIGS. 5a and 5b.
Figure 6B:
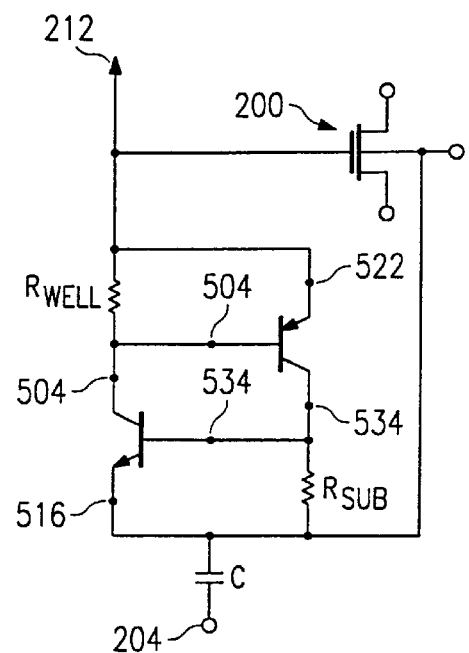

FIGS. 6*a* and 6*b* are schematics of the protection device of FIGS. 5*a* and 5*b*. The reference numerals are utilized to depict which regions illustrated in FIGS. 5*a* and 5*b* form the elements of the transistors of FIG. 6*b*.

Figure 7:
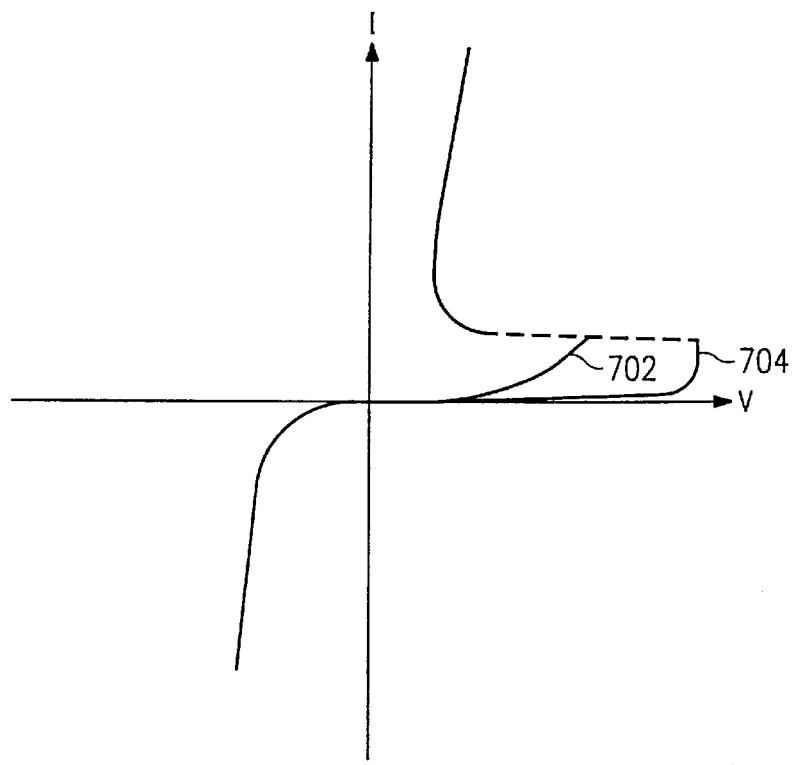
FIG. 7 is an I–V curve illustrating the performance of the device depicted in FIGS. 5a, 5b, and 6.

FIG. 7 illustrates the I–V characteristics of the protective device 500. Plot 700 illustrates the I–V characteristics of the thyristor of FIGS. 5*a*, 5*b*, and 6 wherein the active region of the thyristor is not "illuminated" (or is shielded from illumination). Plot 702 illustrates the I–V characteristics of the same thyristor of the instant invention wherein the transistor is "illuminated" with electromagnetic energy 530 (preferably "white" light ultraviolet light infrared light, or other spectral electromagnetic radiation) through illumination window 502. The illumination of the reverse-biased collector-base junction with electromagnetic energy results in the generation of electrons and holes. The electrons are conducted through n-well 504 to the n-well contact 510. This electron current sets up a voltage drop in n-well 504 which enables the emitter-base junction of the PNP transistor to become substantially forward biased, thus turning on the PNP transistor. In a similar manner, the generated holes are conducted in the substrate to substrate contact 518. The voltage drop enables the emitter-base junction of the NPN transistor to be forward biased thus tuning on the NPN transistor. When the PNP and the NPN transistors are turned on the SCR is triggered and the impedance of the device drops substantially. The voltage required to maintain the SCR in the "on" state is significantly lower than the blocking voltage of the previously reversed-biased junctions. This voltage drop is indicated in plot 702 of FIG. 7. Note, that the plots are basically the same except that the "turn on" voltage is less for the thyristor that is "illuminated".

Although specific embodiments of the present invention are herein described, they are not to be construed as limiting the scope of the invention. Many embodiments of the present invention will become apparent to those skilled in the art in light of methodology of the specification. More specifically, while field oxide regions (136 and 532) are shown in FIGS. 1*b* and 5*b,* it is possible to replace the field oxide regions situated between the doped regions with insulated gate-structures. In addition, while the aforementioned embodiments relate to devices formed within the substrate, another embodiment would be to utilize a device whose electrical characteristics would change upon the introduction of electromagnetic energy and to form such a device above the substrate. Therefore, the scope of the invention is limited only by the claims appended.

What we claim is:

1. A protection device for protecting a semiconductor device from charge-induced damage during processing, said protection device comprising:

a substrate of a first conductivity type and having a surface, said protection device and said semiconductor device formed on said substrate;

a first doped region of a second conductivity type opposite said first conductivity type and formed in said substrate;

a second doped region formed in said substrate and spaced away from said first doped region;

a first contact/via abutting said first doped region and extending away from said substrate, said first contact/via having an upper surface;

a second contact/via abutting said second doped region and extending away from said substrate, said second contact/via having an upper surface which is spaced from said upper surface of said first contact/via and which extends over substantially all of said second doped region; and an aperture formed by said space between said upper surfaces of said first and second contact/vias, said aperture formed over a portion of said first doped region such that upon introduction of electromagnetic energy during processing upon said protection device said electromagnetic energy will pass through said aperture to said first doped region thereby changing at least one electrical characteristic of said protection device.

2. The protection device of claim 1, wherein said protection device is turned on at a lower potential upon introduction of said electromagnetic energy to said first doped region.

3. The protection device of claim 1, wherein said second doped region is of said second conductivity type and said protection device is a transistor.

4. The protection device of claim 1, wherein said second doped region is of said first conductivity type and said protection device is a diode.

5. The protection device of claim 1, wherein an insulating region is formed between said first and second doped regions.

6. The protection device of claim 1, wherein a gate structure is insulatively disposed on said surface of said substrate and between said first and said second doped regions.

* * * * *